(12) United States Patent
Trinh et al.

(10) Patent No.: US 10,804,464 B2
(45) Date of Patent: Oct. 13, 2020

(54) METHOD OF FORMING MEMORY DEVICE WITH DIFFUSION BARRIER AND CAPPING LAYER

(71) Applicant: Taiwan Semiconductor Manufacturing Co., Ltd., Hsinchu (TW)

(72) Inventors: Hai-Dang Trinh, Hsinchu (TW); Hsing-Lien Lin, Hsinchu (TW); Cheng-Yuan Tsai, Chupei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/821,901

(22) Filed: Nov. 24, 2017

(65) Prior Publication Data
US 2019/0165266 A1 May 30, 2019

(51) Int. Cl.
*H01L 45/00* (2006.01)
(52) U.S. Cl.
CPC .......... *H01L 45/1246* (2013.01); *H01L 45/08* (2013.01); *H01L 45/085* (2013.01); *H01L 45/12* (2013.01); *H01L 45/1233* (2013.01); *H01L 45/1253* (2013.01); *H01L 45/146* (2013.01); *H01L 45/1675* (2013.01)
(58) Field of Classification Search
None
See application file for complete search history.

(56) References Cited

U.S. PATENT DOCUMENTS

| | | | | |
|---|---|---|---|---|
| 8,686,389 B1* | 4/2014 | Wang | .................... | H01L 45/145 |
| | | | | 257/2 |
| 8,835,890 B2* | 9/2014 | Hsueh | ................. | H01L 45/1608 |
| | | | | 257/2 |
| 8,981,332 B2* | 3/2015 | Chiang | .............. | G11C 13/0002 |
| | | | | 257/4 |
| 9,184,379 B1* | 11/2015 | Wang | .................. | H01L 45/1641 |
| 2006/0084247 A1 | 4/2006 | Liu | | |
| 2009/0278110 A1* | 11/2009 | Gorer | ...................... | H01L 45/10 |
| | | | | 257/4 |
| 2010/0065803 A1 | 3/2010 | Choi et al. | | |
| 2010/0102291 A1 | 4/2010 | Xu | | |
| 2011/0291066 A1* | 12/2011 | Baek | ....................... | H01L 45/08 |
| | | | | 257/4 |

(Continued)

FOREIGN PATENT DOCUMENTS

KR 10-2008-0050989 A 6/2008
KR 10-2015-0103536 A 9/2015

*Primary Examiner* — Lex H Malsawma
(74) *Attorney, Agent, or Firm* — Birch, Stewart, Kolasch & Birch, LLP

(57) ABSTRACT

A structure and formation method of a semiconductor device structure is provided. The method includes forming a lower electrode layer over a semiconductor substrate and forming a data storage layer over the lower electrode layer. The method also includes forming an ion diffusion barrier layer over the data storage layer and forming a capping layer over the ion diffusion barrier layer. The ion diffusion barrier layer is a metal material doped with nitrogen, carbon, or a combination thereof. The capping layer is made of a metal material. The method further includes forming an upper electrode layer over the capping layer.

20 Claims, 11 Drawing Sheets

(56) References Cited

U.S. PATENT DOCUMENTS

| | | | |
|---|---|---|---|
| 2012/0313063 A1* | 12/2012 | Wang | H01L 45/065 257/2 |
| 2014/0103284 A1* | 4/2014 | Hsueh | H01L 45/1608 257/4 |
| 2014/0166969 A1* | 6/2014 | Tendulkar | H01L 45/1608 257/4 |
| 2015/0090949 A1* | 4/2015 | Chang | H01L 45/1253 257/4 |
| 2015/0176122 A1* | 6/2015 | Hsueh | C23C 16/44 428/141 |
| 2015/0188043 A1* | 7/2015 | Wang | H01L 45/146 257/4 |
| 2015/0249093 A1 | 9/2015 | Lee et al. | |
| 2015/0287917 A1* | 10/2015 | Dang | H01L 45/1641 257/4 |
| 2016/0064664 A1 | 3/2016 | Dang et al. | |
| 2016/0248008 A1 | 8/2016 | Chen et al. | |
| 2018/0219154 A1* | 8/2018 | Majhi | H01L 45/08 |

* cited by examiner

METHOD OF FORMING MEMORY DEVICE WITH DIFFUSION BARRIER AND CAPPING LAYER

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
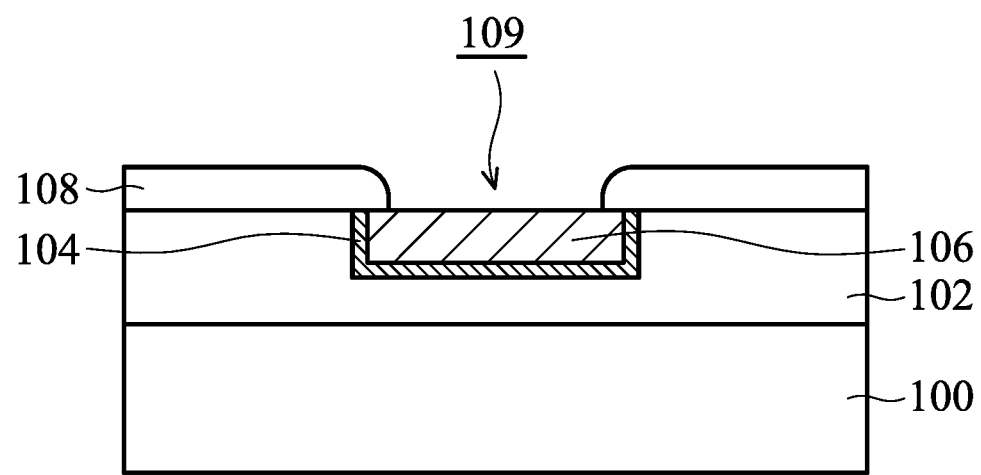
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a semiconductor device structure, in accordance with some embodiments. In some embodiments, the semiconductor device structure to be formed includes a resistive random access memory (RRAM) structure. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

In some embodiments, a dielectric layer 102 is formed over the semiconductor substrate 100, as shown in FIG. 1A. The dielectric layer 102 may include multiple sub-layers. The dielectric layer 102 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof.

In some embodiments, multiple conductive features are formed in the dielectric layer 102. The conductive features may include conductive contacts, conductive lines, and/or conductive vias. The dielectric layer 102 and the conductive features formed therein are a portion of an interconnection structure that will be subsequently formed. The formation of the dielectric layer 102 and the conductive features in the dielectric layer 102 may involve multiple deposition processes, patterning processes, and planarization processes. The device elements in and/or on the semiconductor substrate 100 will be interconnected through the interconnection structure to be formed over the semiconductor substrate 100.

In some embodiments, a conductive feature 106 is formed in the dielectric layer 102, as shown in FIG. 1A. The conductive feature 106 may be a conductive line. In some embodiments, a barrier layer 104 is formed between the conductive feature 106 and the dielectric layer 102. The barrier layer 104 may be used to prevent metal ions of the conductive features 104 from diffusing into the dielectric layer 102.

In some embodiments, trenches are formed in the dielectric layer 102. Each of the trenches may connect a via hole (not shown). The trenches are used to contain conductive lines and the barrier layer. The formation of the trenches may involve photolithography processes and etching processes. Afterwards, the barrier layer 104 is deposited over the dielectric layer 102. The barrier layer 104 extends on sidewalls and bottom portions of the trenches. The barrier layer 104 may be made of or include tantalum nitride, titanium nitride, one or more other suitable materials, or a combination thereof. The barrier layer 104 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive material layer is deposited over the barrier layer 104 to fill the trenches, in accordance with some embodiments. The conductive material layer may be made of or include copper, cobalt, tungsten, titanium, nickel, gold, platinum, graphene, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, the barrier layer 104 and the conductive material layer outside of the trenches are removed, in accordance with some embodiments. Remaining portions of the conductive material layer in one of the trenches form the conductive feature 106. In some embodiments, the barrier layer 104 and the conductive material layer outside of the trenches are removed using a planarization process. The planarization process may include a CMP process, a dry polishing process, a mechanical grinding process, an etching process, one or more other applicable processes, or a combination thereof.

As shown in FIG. 1A, a dielectric layer 108 is deposited over the dielectric layer 102 and the conductive feature 106, in accordance with some embodiments. The dielectric layer 108 may be made of or include silicon carbide (SiC), nitrogen-doped silicon carbide, oxygen-doped silicon carbide, silicon nitride (SiN), silicon oxynitride (SiON), silicon oxide, one or more other suitable materials, or a combination thereof. The dielectric layer 108 may be deposited using a CVD process, an ALD process, a PVD process, one or more other applicable processes, or a combination thereof. In some embodiments, the dielectric layer 108 is patterned to form an opening 109 that exposes the conductive feature 106, as shown in FIG. 1A.

Figure 1B:
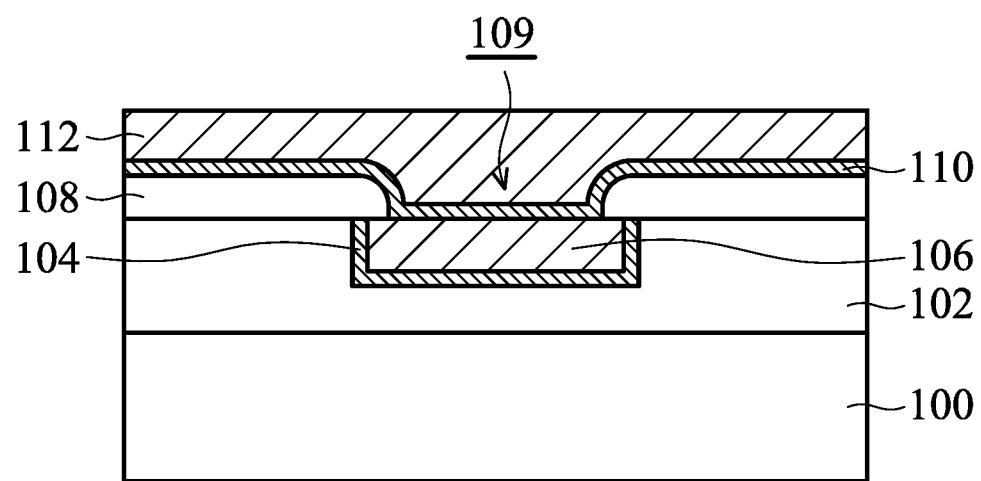

As shown in FIG. 1B, a barrier layer 110 is deposited over the dielectric layer 108, in accordance with some embodiments. The barrier layer 110 extends on the sidewalls and bottom portion of the opening 109. The barrier layer 110 may be made of or include tantalum nitride, titanium nitride, one or more other suitable materials, or a combination thereof. The barrier layer 110 may be deposited using a chemical vapor deposition (CVD) process, an atomic layer deposition (ALD) process, a physical vapor deposition (PVD) process, an electroplating process, an electroless plating process, one or more other applicable processes, or a combination thereof.

Afterwards, a conductive layer 112 is deposited over the barrier layer 110, as shown in FIG. 1B in accordance with some embodiments. The conductive layer 112 may fill the opening 109. The conductive layer 112 is used as a lower electrode layer of a memory device that will be formed. The conductive layer 112 may be made of or include copper, cobalt, tungsten, titanium, nickel, gold, platinum, graphene, one or more other suitable materials, or a combination thereof. The conductive layer 112 may be deposited using a CVD process, an ALD process, a PVD process, an electroplating process, an electroless plating process, one or more other applicable processes, or a combination thereof.

In some embodiments, the conductive layer 112 is planarized to provide the conductive layer 112 with a substantially planarized surface, which may facilitate subsequent formation processes. The conductive layer 112 may be planarized using a chemical mechanical polishing (CMP) process, a grinding process, a dry polishing process, an etching process, one or more other applicable processes, or a combination thereof.

Figure 1C:
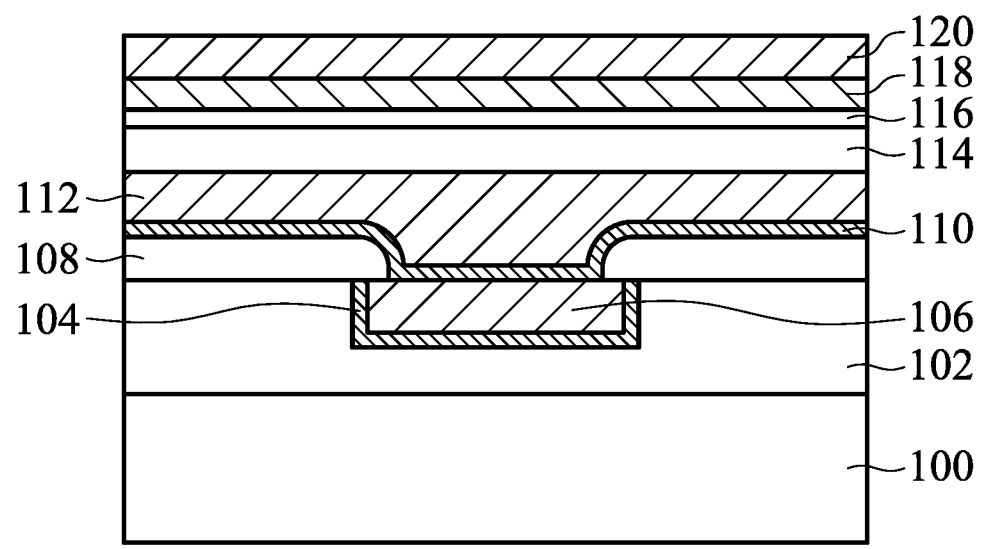

As shown in FIG. 1C, a data storage layer 114 is deposited over the conductive layer 112, in accordance with some embodiments. The data storage layer 114 is configured to store data unit. In some embodiments, the data storage layer 114 is a resistance variable layer which has a variable resistance representing the data unit. Depending upon the voltage applied across the data storage layer 114, the variable resistance can be changed between different resistance states corresponding to different data states of the data unit.

The data storage layer 114 may have reduced resistance after a sufficiently high voltage is applied to the data storage layer 114. The applied voltage may induce ions (such as oxygen ions and/or nitrogen ions) in the data storage layer 114 to move to the electrodes. As a result, a series of vacancies are formed in the data storage layer 114. These vacancies may together form one or more conductive paths. For example, through a forming process, one or more conductive paths (for example, conductive filaments) may be formed in the data storage layer 114 so that the resistance of the data storage layer 114 is reduced significantly.

A reverse voltage may be applied to partially destroy the formed conductive filaments or the conductive paths. As a result, the resistance of the data storage layer 114 is increased. Therefore, the resistance of the data storage layer 114 may be adjusted through the application of voltage. The data may be stored in the data storage layer 114. By detecting the current passing through the data storage layer 114, information about the resistance of the data storage layer 114 is obtained. Therefore, the stored data is also obtained correspondingly.

In some embodiments, the data storage layer 114 is made of a dielectric material and is usually electrically insulating. The data storage layer 114 may be made of or include a metal oxide, a metal nitride, or a combination thereof. In some embodiments, the data storage layer 114 is made of an oxygen-containing dielectric material. In some embodiments, the material of the data storage layer 114 includes hafnium oxide, aluminum oxide, tantalum oxide, zirconium oxide, hafnium aluminum oxide, one or more other suitable materials, or a combination thereof. In some embodiments, the data storage layer 114 has a thickness that is in a range from about 5 Å to about 100 Å.

Many methods may be used to form the data storage layer 114. In some embodiments, the data storage layer 114 is deposited using an ALD process, a CVD process, a PVD process, a spin-on process, a spraying coating process, one or more other applicable processes, or a combination thereof.

In some embodiments, the data storage layer 114 is in direct contact with the conductive layer 112 which serves as a lower electrode layer. In some embodiments, due to the substantially planar surface provided by the planarized conductive layer 112, adhesion between the data storage layer 114 and the conductive layer 112 is improved.

Afterwards, an ion diffusion barrier layer 116 is deposited over the data storage layer 114, as shown in FIG. 1C in accordance with some embodiments. In some embodiments, the ion diffusion barrier layer 116 is configured to prevent or slow material from diffusing from and/or into the data storage layer 114. In some embodiments, the ion diffusion barrier layer 116 is used to slow oxygen ions from diffusing from and/or into the data storage layer 114. In some embodiments, the ion diffusion barrier layer 116 is formed directly on the data storage layer 114. In these cases, the ion diffusion barrier layer 116 is in direct contact with the data storage layer 114.

In some embodiments, the ion diffusion barrier layer 116 is made of a metal material doped with nitrogen, carbon, or a combination thereof. The metal material mentioned above may include titanium (Ti), tungsten (W), hafnium (Hf), zirconium (Zr), tantalum (Ta), aluminum (Al), lanthanum (La), one or more other suitable or similar metal materials, or a combination thereof. For example, the ion diffusion barrier layer 116 is made of or includes nitrogen-doped titanium, nitrogen-doped tantalum, carbon-dopedtitanium, carbon-doped tantalum, one or more other suitable metal materials doped with nitrogen and/or carbon, or a combination thereof.

In some embodiments, the ion diffusion barrier layer 116 is formed to have an appropriate atomic concentration of nitrogen or carbon that is in a range from about 10% to about 45%. In some cases, if the atomic concentration of nitrogen or carbon is smaller than about 10%, the ion diffusion barrier layer 116 may not have sufficient barrier ability. In some other cases, if the atomic concentration of nitrogen or carbon is greater than about 45%, the ion diffusion barrier layer 116 may have barrier ability that is too strong. As a result, ions such as oxygen ions may not be able to diffuse from and/or into the data storage layer 114.

However, many variations and/or modifications may be made to embodiments of the disclosure. The ion diffusion barrier layer 116 may have a different atomic concentration of nitrogen or carbon. In some other embodiments, the ion diffusion barrier layer 116 is formed to have an atomic concentration of nitrogen or carbon that is in a range from about 20% to about 35%.

In some embodiments, the ion diffusion barrier layer 116 is formed to have an appropriate thickness that is in a range from about 5 Å to about 70 Å. In some cases, if the thickness of the ion diffusion barrier layer 116 is smaller than about 5 Å, the ion diffusion barrier layer 116 may not have sufficient barrier ability. In some other cases, if the thickness of the ion diffusion barrier layer 116 is greater than about 70 Å, the ion diffusion barrier layer 116 may have barrier ability that is too strong. As a result, ions such as oxygen ions may not be able to diffuse from and/or into the data storage layer 114.

However, many variations and/or modifications may be made to embodiments of the disclosure. The ion diffusion barrier layer 116 may have a different thickness. In some other embodiments, the ion diffusion barrier layer 116 is formed to have a thickness that is in a range from about 15 Å to about 50 Å.

In some embodiments, the ion diffusion barrier layer 116 is deposited using an ALD process, a CVD process, a PVD process, one or more other applicable processes, or a combination thereof. In some embodiments, the deposition of the ion diffusion barrier layer 116 involves the usage of a metal-containing gas and a dopant-containing gas. The dopant-containing gas may be or include a nitrogen-containing gas, a carbon-containing gas, one or more other suitable gases, or a combination thereof.

Many variations and/or modifications can be made to embodiments of the disclosure. In some other embodiments, a metal layer is deposited over the data storage layer 114. Afterwards, an ion implantation process is used to dope the metal layer with nitrogen and/or carbon. As a result, the ion diffusion barrier layer 116 made of a metal material doped with nitrogen and/or carbon is formed.

As shown in FIG. 1C, a capping layer 118 is afterwards deposited over the ion diffusion barrier layer 116, in accordance with some embodiments. In some embodiments, the capping layer 118 is used as an ion reservoir region. The capping layer 118 may induce the formation of vacancies in the data storage layer 114 during subsequent forming process and/or setting process. For example, the capping layer 118 is used to receive oxygen ions from the data storage layer 114. As a result, vacancies forming the conductive paths or conductive filaments are formed in the data storage layer 114. The forming and/or setting processes may therefore be achieved.

In some embodiments, the capping layer 118 is thicker than the ion diffusion barrier layer. In some embodiments, the capping layer 118 is formed to have an appropriate thickness that is in a range from about 10 Å to about 150 Å. In some cases, if the thickness of the capping layer 118 is smaller than about 10 Å, the capping layer 118 may not be able to contain a sufficient amount of oxygen ions from the data storage layer 114. As a result, the forming and/or setting processes may not be easy to perform. In some other cases, if the thickness of the capping layer 118 is greater than about 150 Å, the operation speed for the reset process may be slowed down. In some embodiments, the ratio of the thickness of the ion diffusion barrier layer 116 to the thickness of the capping layer 118 is in a range from about 0.02 to about 0.2.

In some embodiments, the capping layer 118 is made of a metal material. In some embodiments, the capping layer 118 is made of or includes titanium (Ti), hafnium (Hf), zirconium (Zr), lanthanum (La), tantalum (Ta), nickel (Ni), tungsten (W), one or more other suitable metal materials, or a combination thereof. In some embodiments, the capping layer 118 is made of a pure metal material or a combination of pure metal materials. In some embodiments, the capping layer 118 includes substantially no nitrogen or carbon. In some embodiments, the capping layer 118 is deposited using a PVD process, a CVD process, an ALD process, a plating process, one or more other applicable processes, or a combination thereof.

Afterwards, a conductive layer 120 is deposited over the capping layer 118, as shown in FIG. 1C in accordance with some embodiments. The conductive layer 120 is used as an upper electrode layer of a memory device that will be formed. The conductive layer 120 may be made of or include copper, cobalt, tungsten, titanium, nickel, gold, platinum, graphene, one or more other suitable materials, or a combination thereof. The conductive layer 120 may be deposited using a CVD process, an ALD process, a PVD process, an electroplating process, an electroless plating process, one or more other applicable processes, or a combination thereof.

Figure 1D:
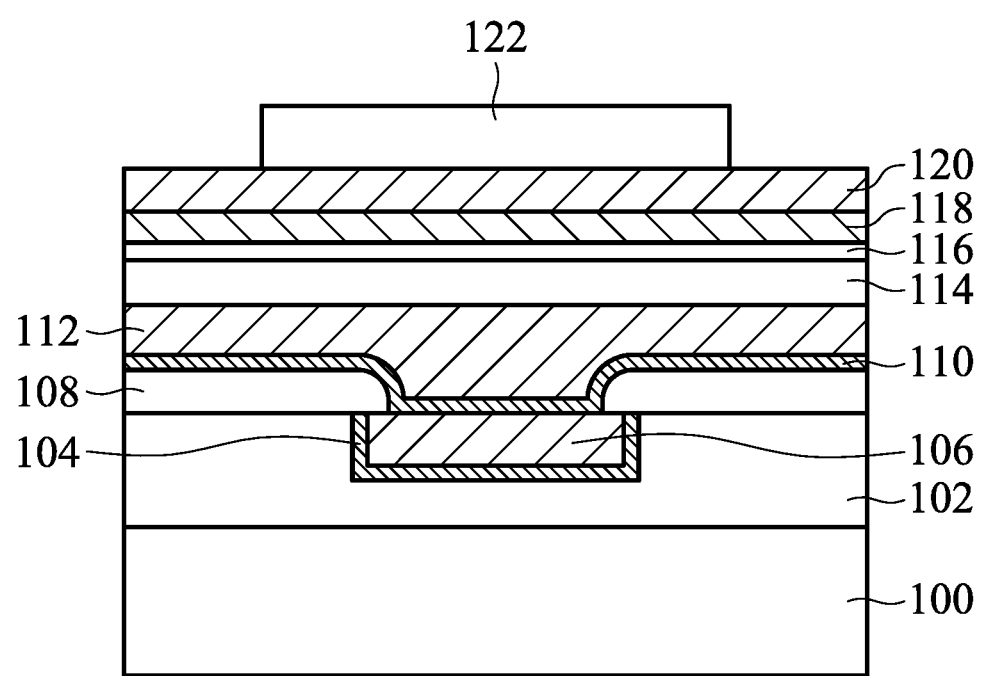

As shown in FIG. 1D, a mask element 122 is formed over the conductive layer 120, in accordance with some embodiments. The mask element 122 is used to assist in subsequent patterning process of the conductive layer 120, the capping layer 118, and the ion diffusion barrier layer 116. The mask element 122 may be made of or include silicon nitride, silicon oxynitride, silicon oxide, one or more other suitable materials, or a combination thereof. A photolithography process and an etching process may be used to form the mask element 122.

Many variations and/or modifications can be made to embodiments of the disclosure. In some other embodiments, the mask element 122 is not formed.

Figure 1E:
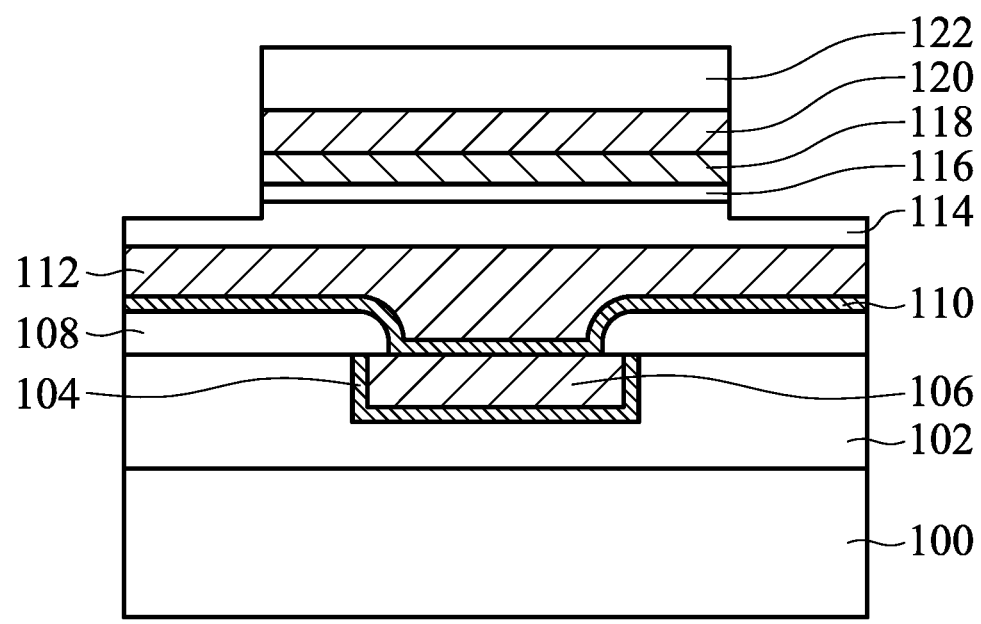

As shown in FIG. 1E, the conductive layer 120, the capping layer 118, and the ion diffusion barrier layer 116 are partially removed to be patterned, in accordance with some embodiments. After the patterning processes, the data storage layer 114 is exposed. In some embodiments, the conductive layer 120, the capping layer 118, and the ion diffusion barrier layer 116 are partially removed using one or more etching processes. In some embodiments, the data storage layer 114 is partially removed during the patterning of the conductive layer 120, the capping layer 118, and the ion diffusion barrier layer 116.

Figure 1F:
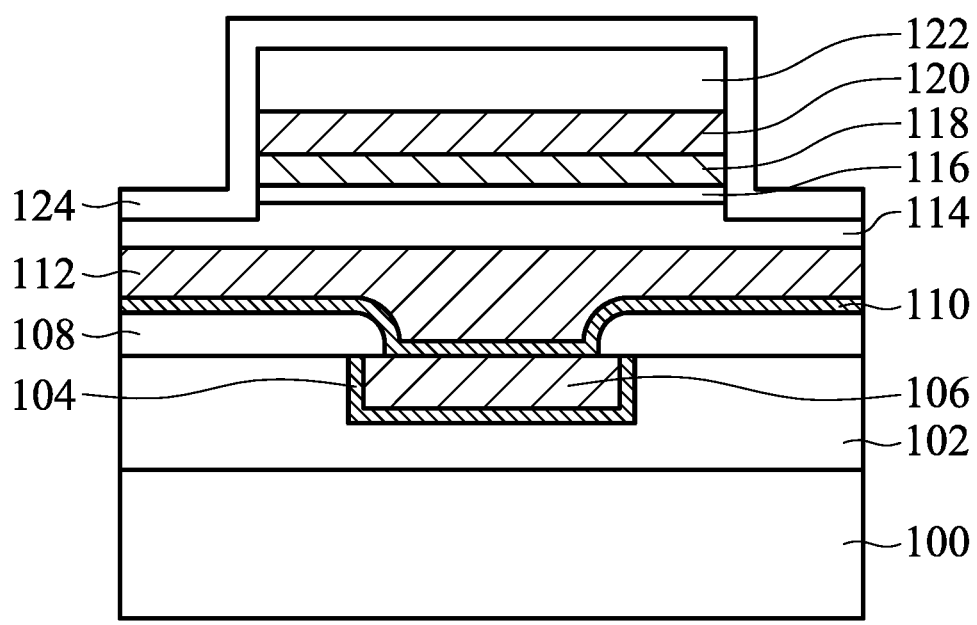

As shown in FIG. 1F, a protective layer 124 is deposited over the structure shown in FIG. 1E, in accordance with some embodiments. The protective layer 124 may be made of or include silicon nitride, silicon oxynitride, silicon oxide, one or more other suitable materials, or a combination thereof. In some embodiments, the protective layer 124 is deposited using a CVD process, an ALD process, a spin-on process, a PVD process, one or more other applicable processes, or a combination thereof.

Figure 1G:
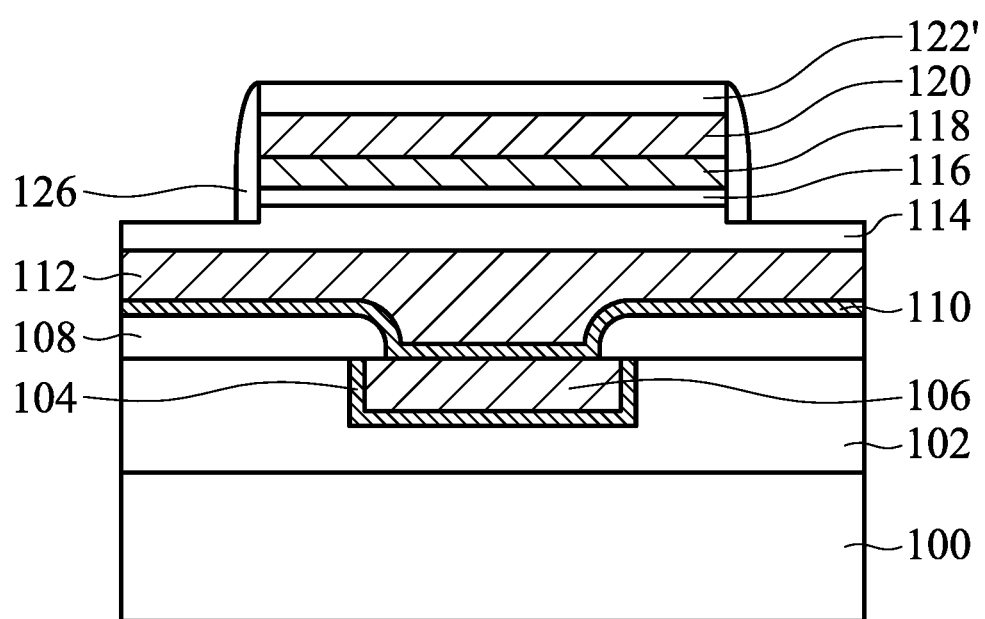

As shown in FIG. 1G, the protective layer 124 is partially removed to form a protective element 126, in accordance with some embodiments. The protective element 126 covers sidewalls of the conductive layer 120, the capping layer 118, and the ion diffusion barrier layer 116. An etching process may be used to form the protective element 126. During the etching process, the mask element 122 may also be etched. As a result, a mask element 122' with a smaller thickness may be formed.

Many variations and/or modifications can be made to embodiments of the disclosure. In some other embodiments, the protective layer 124 or the protective element 126 is not formed.

Figure 1H:
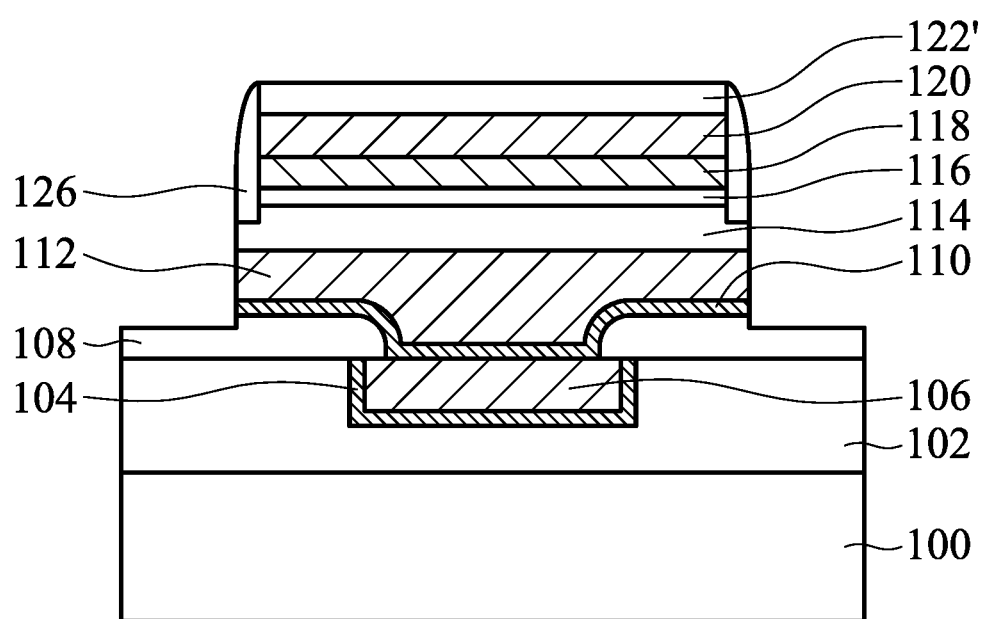

As shown in FIG. 1H, the data storage layer 114, the conductive layer 112, and the barrier layer 110 are partially removed to be patterned, in accordance with some embodiments. In some embodiments, the data storage layer 114, the conductive layer 112, and the barrier layer 110 are partially removed using one or more etching processes. The protective element 126 and the mask element 122' may together function as an etching mask during the patterning of the data storage layer 114, the conductive layer 112, and the barrier layer 110.

Figure 1I:
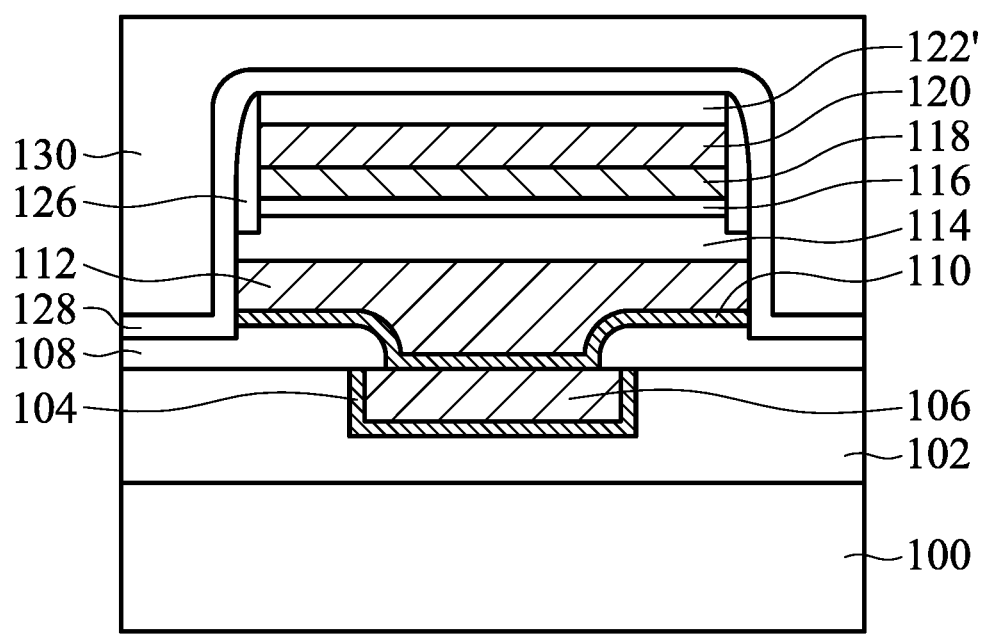

As shown in FIG. 1I, a protective layer 128 is deposited over the structure shown in FIG. 1H, in accordance with some embodiments. In some embodiments, the protective layer 128 contains silicon, oxygen, and/or carbon. The protective layer 128 may be made of or include silicon oxide, silicon nitride, silicon carbide, silicon oxynitride, one or more other suitable materials, or a combination thereof. In some embodiments, the protective layer 128 is made of a material that is substantially free of oxygen. In some embodiments, the protective layer 128 is a single layer. In some other embodiments, the protective layer 128 includes multiple sub-layers. The sub-layers may be made of the same material. Alternatively, some of the sub-layers are made of different materials. The protective layer 128 may be deposited using a CVD process, an ALD process, a PVD process, a spin-on process, one or more other applicable processes, or a combination thereof.

Afterwards, a dielectric layer 130 is deposited over the protective layer 128, as shown in FIG. 1I in accordance with some embodiments. The dielectric layer 130 may be made of or include carbon-containing silicon oxide, silicon oxide, borosilicate glass (BSG), phosphoric silicate glass (PSG), borophosphosilicate glass (BPSG), fluorinated silicate glass (FSG), porous dielectric material, another suitable low-k dielectric material, one or more other suitable materials, or a combination thereof. The dielectric layer 130 may be deposited using a CVD process, an ALD process, a PVD process, a spin-on process, a spray coating process, one or more other applicable processes, or a combination thereof.

Figure 1J:
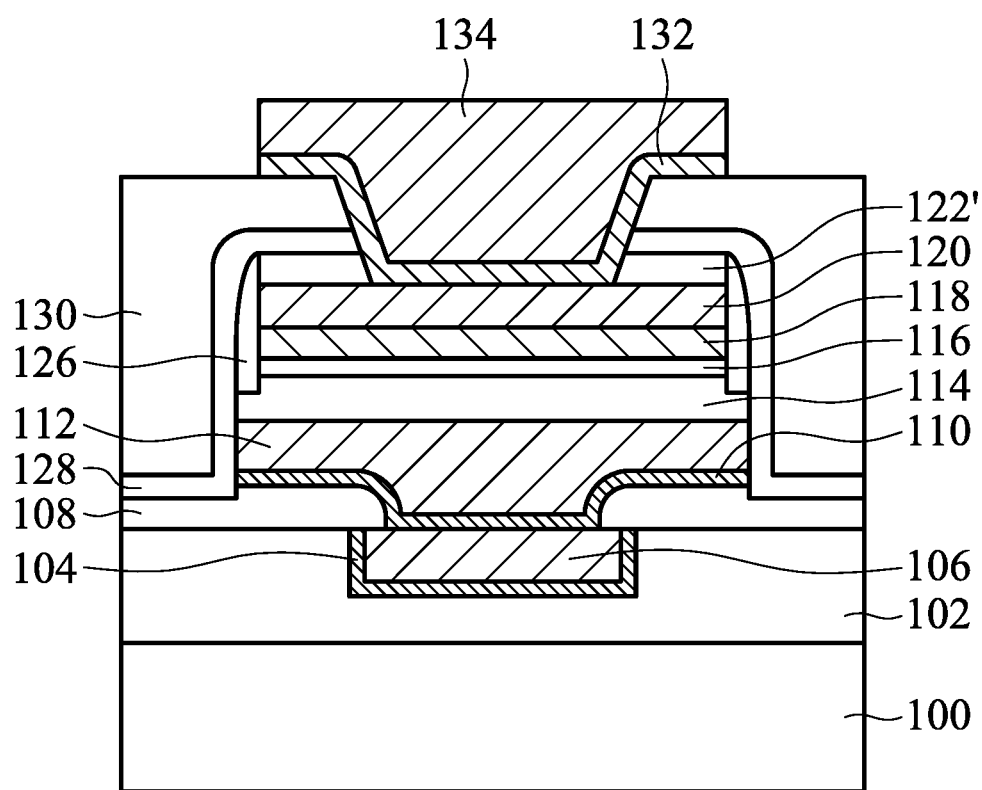

As shown in FIG. 1J, a conductive feature 134 is formed in the dielectric layer 130, in accordance with some embodiments. The conductive feature 134 is electrically connected to the conductive layer 120. In some embodiments, the conductive feature 134 is a conductive via. In some embodiments, the conductive feature 134 is a conductive line. In some embodiments, the conductive feature 134 is a combination of a conductive via and a conductive line which is formed using a dual damascene process.

In some embodiments, a barrier layer 132 is formed before the formation of the conductive feature 134. The material and formation method of the barrier layer 132 may be the same as or similar to those of the barrier layer 104. The material and formation method of the conductive feature 134 may be the same as or similar to those of the conductive feature 106.

As shown in FIG. 1J, a semiconductor device with a resistive random access memory (RRAM) structure is formed, in accordance with some embodiments. The conductive layers 112 and 120 serve as a lower electrode and an upper electrode, respectively. The conductive layers 112 and 120 sandwich the data storage layer 114, the ion diffusion barrier layer 116, and the capping layer 118. The RRAM structure employs oxygen vacancies to manipulate the resistance of the data storage layer 114. When a set voltage is applied across the conductive layers 112 and 120, ions such as oxygen ions in the data storage layer 114 move through the ion diffusion barrier layer 116 to the capping layer 118, thereby re-forming conductive paths (initially formed by a form voltage) from oxygen vacancies and switching the variable resistance to the low resistance state. The set voltage is, for example, a positive voltage. When a reset voltage is applied across the conductive layers 120 and 112, the ions such as oxygen ions move back to the data storage layer 114 through the ion diffusion barrier layer 116, thereby filling the oxygen vacancies and switching the variable resistance to the high resistance state. The reset voltage is, for example, a negative voltage.

Ion diffusion is a challenge for RRAM structure at high operating temperatures or under repeated operations. For example, under the high resistance state, the oxygen ions may slowly diffuse back to the capping layer 116 due to concentration gradient. As a result, the conductive filaments or the conductive paths may be formed again, which decreases resistance of the data storage layer 114. Alternatively, under the low resistance state, the oxygen ions may slowly diffuse back to the data storage layer 114. As a result, the conductive filaments or the conductive paths may be partially destroyed, which increases resistance of the data storage layer 114. As the diffusion occurs, the variable resistance either increases or decreases eventually toggling the state of the variable resistance between the high and low resistivity states. This undesirably changes the state of the data unit represented by the variable resistance, thereby resulting in data corruption and reduced data retention.

In some embodiments, because of the ion diffusion barrier layer 116 formed between the data storage layer 114 and the capping layer 118, the undesired ion diffusion is prevented or slowed down. For example, under the high resistance state, the oxygen ions are prevented from diffusing back to the capping layer 118 from the data storage layer 114 due to the ion diffusion barrier layer 116. Therefore, there is substantially no undesired conductive filament formed in the data storage layer 114. The data storage layer 114 may still be under the high resistance state. For example, under the low resistance state, the oxygen ions are prevented from diffusing back to the data storage layer 114 from the capping layer 118 due to the ion diffusion barrier layer 116. Therefore, the conductive filaments in the data storage layer 114 are prevented from being damaged since oxygen ions are blocked. The data storage layer 114 may still be under the low resistance state. The performance, retention, and reliability of the RRAM structure are improved. In some embodiments, the switching window is improved by about 1.5 times to about 2.5 times, when compared with other embodiments without the ion diffusion barrier layer 116.

Figure 2:
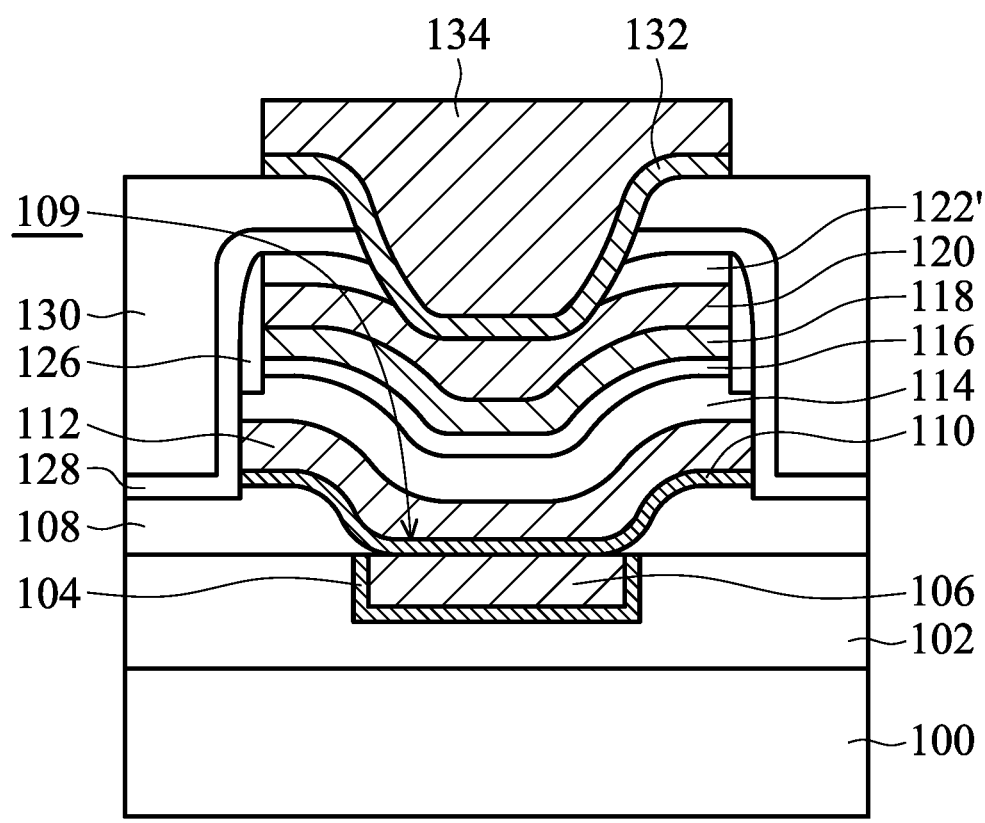
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. In some embodiments, a structure the same as or similar to that shown in FIG. 1A is provided or received. In some embodiments, before the lower electrode layer (such as the conductive layer 112) is formed, the dielectric layer 108 is formed over the semiconductor substrate 100. Afterwards, the opening 109 is formed in the dielectric layer 108. In some embodiments, the barrier layer 110 and the conductive layer 112 are formed. Portions of the barrier layer 110 and the conductive layer 112 extends into the opening 109. In some embodiments, the conductive layer 112 is not planarized. Therefore, the conductive layer 112 includes a curved upper surface. In some embodiments, the subsequently formed layers 114, 116, 118, and 120 also include curved upper surfaces accordingly, as shown in FIG. 2.

Embodiments of the disclosure form a semiconductor device including a resistive random access memory (RRAM) structure. The RRAM structure includes a data storage layer and a capping layer which are sandwiched between a lower electrode and an upper electrode. An ion diffusion barrier layer made of a metal material doped with nitrogen and/or carbon is formed between the data storage layer and the capping layer. The ion diffusion barrier layer may be used to prevent undesired ion diffusion between the data storage layer and the capping layer. Therefore, the quality and reliability of the semiconductor device structure are significantly improved.

In accordance with some embodiments, a method for forming a semiconductor device structure is provided. The method includes forming a lower electrode layer over a semiconductor substrate and forming a data storage layer over the lower electrode layer. The method also includes forming an ion diffusion barrier layer over the data storage layer and forming a capping layer over the ion diffusion barrier layer. The ion diffusion barrier layer is a metal material doped with nitrogen, carbon, or a combination thereof. The capping layer is made of a metal material. The method further includes forming an upper electrode layer over the capping layer.

In accordance with some embodiments, a method for forming a semiconductor device structure is provided. The method includes forming a lower electrode layer over a semiconductor substrate and forming a resistance variable layer over the lower electrode layer. The method also includes forming a barrier layer over the resistance variable layer and forming a capping layer over the barrier layer. The capping layer is made of a metal material, and the capping layer is in direct contact with the barrier layer. The method further includes forming an upper electrode layer over the capping layer.

In accordance with some embodiments, a semiconductor device structure is provided. The semiconductor device structure includes a semiconductor substrate and a lower electrode over the semiconductor substrate. The semiconductor device structure also includes a resistance variable layer over the lower electrode and an ion diffusion barrier layer over the resistance variable layer. The ion diffusion barrier layer is a metal material doped with nitrogen or carbon. The semiconductor device structure further includes a capping layer over the ion diffusion barrier layer, and the capping layer is made of a metal material. In addition, the semiconductor device structure includes an upper electrode over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a lower electrode layer over a semiconductor substrate;
   forming a data storage layer over the lower electrode layer;
   forming an ion diffusion barrier layer over the data storage layer, wherein the ion diffusion barrier layer is a metal material doped with nitrogen, carbon, or a combination thereof;
   forming a capping layer directly on the ion diffusion barrier layer;
   forming an upper electrode layer over the capping layer;

patterning the upper electrode layer, the capping layer, and the ion diffusion barrier layer to expose the data storage layer;

forming a protective element over sidewalls of the upper electrode layer, the capping layer, and the ion diffusion barrier layer after the data storage layer is exposed, wherein the protective element is formed to be in contact with an interface between the data storage layer and the ion diffusion barrier layer; and patterning the data storage layer and the lower electrode layer after the protective element is formed.

2. The method for forming a semiconductor device structure as claimed in claim 1, wherein the data storage layer is partially removed during the patterning of the upper electrode layer, the capping layer, and the ion diffusion barrier layer.

3. The method for forming a semiconductor device structure as claimed in claim 1, wherein the data storage layer is a metal oxide layer.

4. The method for forming a semiconductor device structure as claimed in claim 1, wherein the ion diffusion barrier layer is formed to have an atomic concentration of nitrogen or carbon that is in a range from about 10% to about 45%.

5. The method for forming a semiconductor device structure as claimed in claim 1, wherein the ion diffusion barrier layer is formed using a metal-containing gas and a dopant-containing gas, and the dopant containing gas comprises a nitrogen-containing gas, a carbon-containing gas, or a combination thereof.

6. The method for forming a semiconductor device structure as claimed in claim 1, further comprising planarizing the lower electrode layer before the data storage layer is formed.

7. The method for forming a semiconductor device structure as claimed in claim 1, wherein the ion diffusion barrier layer is formed directly on the data storage layer.

8. The method for forming a semiconductor device structure as claimed in claim 1, wherein the capping layer is formed to be thicker than the ion diffusion barrier layer.

9. The method for forming a semiconductor device structure as claimed in claim 1, wherein the capping layer is made of a pure metal material, and the capping layer is made of titanium, hafnium, zirconium, tantalum, nickel, or tungsten.

10. A method for forming a semiconductor device structure, comprising:
forming a lower electrode layer over a semiconductor substrate;
forming a resistance variable layer over the lower electrode layer;
forming a barrier layer over the resistance variable layer;
forming a capping layer over the barrier layer;
forming an upper electrode layer over the capping layer;
partially etching the upper electrode layer, the capping layer, and the barrier layer to expose the resistance variable layer; and
forming a protective element over sidewalls of the upper electrode layer, the capping layer, and the barrier layer after the resistance variable layer is exposed, wherein the protective element is formed to be in contact with an interface between the resistance variable layer and the barrier layer.

11. The method for forming a semiconductor device structure as claimed in claim 10, wherein the barrier layer is a metal material doped with nitrogen or carbon.

12. The method for forming a semiconductor device structure as claimed in claim 11, wherein the barrier layer is formed to have an atomic concentration of nitrogen or carbon that is in a range from about 10% to about 45%.

13. The method for forming a semiconductor device structure as claimed in claim 10, further comprising partially etching the resistance variable layer and the lower electrode layer after the protective element is formed.

14. The method for forming a semiconductor device structure as claimed in claim 10, further comprising:
forming a dielectric layer over the semiconductor substrate before the lower electrode layer is formed; and
forming an opening in the dielectric layer, wherein a portion of the lower electrode layer and a portion of the resistance variable layer are formed in the opening of the dielectric layer.

15. The method for forming a semiconductor device structure as claimed in claim 10, wherein the capping layer is made of a pure metal material, and the capping layer is made of titanium, hafnium, zirconium, tantalum, nickel, or tungsten.

16. A method for forming a semiconductor device structure, comprising:
forming a lower electrode layer over a semiconductor substrate;
forming a resistance variable layer over the lower electrode layer;
forming an ion diffusion barrier layer directly on the resistance variable layer, wherein the ion diffusion barrier layer is a conductive material doped with nitrogen, carbon, or a combination thereof;
forming a capping layer directly on the ion diffusion barrier layer;
forming an upper electrode layer over the capping layer;
forming a protective element over sidewalls of the upper electrode layer, the capping layer, and the ion diffusion barrier layer, wherein the protective element is formed to be in contact with an interface between the resistance variable layer and the ion diffusion barrier layer.

17. The method for forming a semiconductor device structure as claimed in claim 16, wherein the ion diffusion barrier layer is formed to have an atomic concentration of nitrogen or carbon that is in a range from about 10% to about 45%.

18. The method for forming a semiconductor device structure as claimed in claim 16, wherein the capping layer is formed to be thicker than the ion diffusion barrier layer.

19. The method for forming a semiconductor device structure as claimed in claim 16, further comprising:
partially etching the upper electrode layer, the capping layer, and the ion diffusion layer before the protective element is formed; and
partially etching the resistance variable layer and the lower electrode layer after the protective element is formed.

20. The method for forming a semiconductor device structure as claimed in claim 19, wherein a bottom surface of the protective element is between a top surface of the resistance variable layer and a bottom surface of the resistance variable layer.

* * * * *